United States Patent
Jung et al.

(10) Patent No.: US 11,672,139 B2
(45) Date of Patent: *Jun. 6, 2023

(54) DISPLAY DEVICE

(71) Applicant: Samsung Display Co., Ltd., Yongin-Si (KR)

(72) Inventors: Youn Hwan Jung, Hwaseong-si (KR); Kyu Han Bae, Asan-si (KR); Jae Lok Cha, Hwaseong-si (KR); Kang Yong Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 202 days.

This patent is subject to a terminal disclaimer.

(21) Appl. No.: 17/145,814

(22) Filed: Jan. 11, 2021

(65) Prior Publication Data

US 2021/0135152 A1     May 6, 2021

Related U.S. Application Data

(63) Continuation of application No. 16/505,671, filed on Jul. 8, 2019, now Pat. No. 10,892,441, which is a
(Continued)

(30) Foreign Application Priority Data

Jul. 3, 2017    (KR) ........................ 10-2017-0084440

(51) Int. Cl.
*H01L 33/48*        (2010.01)
*H01L 33/44*        (2010.01)
(Continued)

(52) U.S. Cl.
CPC ........ *H01L 51/5246* (2013.01); *H01L 27/323* (2013.01); *H01L 51/529* (2013.01);
(Continued)

(58) Field of Classification Search
CPC ..... H01L 51/5246; H01L 33/44; H01L 33/52; H01L 33/54; H01L 33/56
See application file for complete search history.

(56) References Cited

U.S. PATENT DOCUMENTS 1,674,572 A    6/1928   Rosche
6,113,450 A    9/2000   Narayanan et al.
(Continued)

FOREIGN PATENT DOCUMENTS

CN          105977274 A    9/2016
KR    10-2009-0110052 A    10/2009
(Continued)

*Primary Examiner* — David A Zarneke
(74) *Attorney, Agent, or Firm* — Innovation Counsel LLP

(57) ABSTRACT

Provided is a display device, comprising a display panel which comprises a first area and a second area located around the first area; and an under-panel sheet which is located under the display panel and overlaps the first area and the second area, wherein the under-panel sheet comprises a buffer member and a strength reinforcing member, wherein the strength reinforcing member is thinner than the buffer member, and a ratio of a thickness of the buffer member to a thickness of the strength reinforcing member is 3 to 6 times.

14 Claims, 13 Drawing Sheets

Related U.S. Application Data continuation of application No. 15/867,247, filed on Jan. 10, 2018, now Pat. No. 10,374,191.

(51) Int. Cl.
*H01L 33/64* (2010.01)
*H01L 33/12* (2010.01)
*H01L 51/52* (2006.01)
*H01L 27/32* (2006.01)
*H01L 51/00* (2006.01)

(52) U.S. Cl.
CPC .......... H01L 51/5237 (2013.01); *H01L 33/12* (2013.01); *H01L 33/44* (2013.01); *H01L 33/48* (2013.01); *H01L 33/483* (2013.01); *H01L 33/64* (2013.01); *H01L 51/0097* (2013.01); *H01L 2251/5338* (2013.01)

(56) References Cited

U.S. PATENT DOCUMENTS

| | | | |
|---|---|---|---|
| 8,257,130 B2 | 9/2012 | Ito et al. | |
| 8,475,618 B2 | 7/2013 | Matsumoto et al. | |
| 8,692,461 B2 | 4/2014 | Ha et al. | |
| 8,821,677 B2 | 9/2014 | Ito et al. | |
| 9,299,943 B2 | 3/2016 | Shimomura et al. | |
| 9,935,278 B2 | 4/2018 | Kim et al. | |
| 9,948,343 B2 | 4/2018 | Moon et al. | |
| 9,961,789 B2 | 5/2018 | Kim et al. | |
| 10,276,810 B2 | 4/2019 | Kim et al. | |
| 10,674,572 B2 | 6/2020 | Cho et al. | |
| 10,842,033 B2 | 11/2020 | Kim et al. | |
| 10,892,441 B2 * | 1/2021 | Jung | H01L 51/529 |
| 2011/0001146 A1 | 1/2011 | Yamazaki et al. | |
| 2013/0264549 A1 | 10/2013 | Yamazaki et al. | |
| 2015/0034981 A1 | 2/2015 | Tamagawa et al. | |
| 2015/0309637 A1 | 10/2015 | Sakuishi et al. | |
| 2017/0069664 A1 | 3/2017 | Nakamura et al. | |
| 2017/0294618 A1 | 10/2017 | Ko et al. | |
| 2018/0022881 A1 | 1/2018 | Seki et al. | |
| 2018/0031751 A1 | 2/2018 | Sugiyama | |
| 2018/0138102 A1 | 5/2018 | Pan et al. | |
| 2018/0182940 A1 | 6/2018 | Yamamoto et al. | |
| 2018/0299193 A1 | 10/2018 | Burkot et al. | |
| 2019/0072997 A1 | 3/2019 | Cha et al. | |
| 2019/0239374 A1 | 8/2019 | Cha | |

FOREIGN PATENT DOCUMENTS

| | | |
|---|---|---|
| KR | 10-2014-0032648 A | 3/2014 |
| KR | 10-1465580 B1 | 11/2014 |
| KR | 10-2015-0026445 A | 3/2015 |
| KR | 10-2015-0047800 A | 5/2015 |
| KR | 10-2016-0030599 A | 3/2016 |
| KR | 10-2016-0110674 A | 9/2016 |
| KR | 10-1710647 A | 2/2017 |
| KR | 10-2017-0025985 A | 3/2017 |
| KR | 10-2017-0059066 A | 5/2017 |

* cited by examiner

DISPLAY DEVICE

This application is a continuation application of U.S. patent application Ser. No. 16/505,671 filed on Jul. 8, 2019, which is a continuation application of U.S. patent application Ser. No. 15/867,247 filed on Jan. 10, 2018 (now U.S. Pat. No. 10,374,191), claims the benefit of Korean Patent Application No. 10-2017-0084440, filed on Jul. 3, 2017, in the Korean Intellectual Property Office, the disclosure of which is incorporated herein by reference in its entirety.

BACKGROUND

1. Field

The present inventive concept relates to a display device.

2. Description of the Related Art

Organic light emitting displays have excellent luminance, driving voltage and response speed characteristics and can be multi-colored. Due to these advantages, the organic light emitting displays are being applied to various products, mainly smartphones. An organic light emitting display includes a display panel including an organic light emitting element. In the organic light emitting element, a cathode and an anode are arranged around an organic light emitting layer. When a voltage is applied to both electrodes, visible light is generated from the organic light emitting layer connected to the electrodes.

Organic light emitting displays are widely used in portable electronic devices such as smartphones, and are easily exposed to external impact. Further, since an organic light emitting layer is vulnerable to moisture, an organic light emitting display can be damaged by a liquid introduced from the outside. To protect against such dangers, the display device includes functional members having functions such as buffer and waterproof functions.

SUMMARY

Aspects of the inventive concept provide a display device having an enhanced strength reinforcing function.

Aspects of the inventive concept also provide a display device having an enhanced waterproof function.

However, aspects of the inventive concept are not restricted to the one set forth herein. The above and other aspects of the inventive concept will become more apparent to one of ordinary skill in the art to which the inventive concept pertains by referencing the detailed description of the inventive concept given below.

According to an aspect of the inventive concept, there is provided a display device comprising a display panel which comprises a first area and a second area located around the first area; and an under-panel sheet which is located under the display panel and overlaps the first area and the second area, wherein the under-panel sheet comprises a buffer member and a strength reinforcing member, wherein the strength reinforcing member is thinner than the buffer member, and a ratio of a thickness of the buffer member to a thickness of the strength reinforcing member is about 3 to about 6 times.

According to another aspect of the inventive concept, there is provided a display device comprising a display panel which comprises a first area and a second area located around the first area, a window which is disposed on the display panel and comprises a third area overlapping the display panel and a fourth area protruding outward from the display panel, an under-panel sheet which is disposed under the display panel and overlaps the first area and the second area, and a waterproof member which is disposed around the under-panel sheet, wherein the waterproof member comprises a plurality of line-shaped waterproof tapes extending along sides of the under-panel sheet and a plurality of waterproof resins, each disposed in a space between the waterproof tapes.

According to another aspect of the inventive concept, there is provided a display device comprising a display panel, a window which is disposed on the display panel and comprises a first area overlapping the display panel and a second area protruding outward from the display panel, an under-panel sheet which is disposed under the display panel and overlaps the display panel, and a waterproof member which is disposed on the second area of the window and does not overlap the under-panel sheet.

Any of the aspects of the inventive concept may additionally have the display device wherein the first area is generally located in a plane, and the second area is located in a plane different from the plane.

The display device may have wherein the strength reinforcing member comprises polyimide (PI) or polyethylene terephthalate (PET).

The display device may have wherein the thickness of the strength reinforcing member is about 25 to about 50 µm.

The display device may have wherein the thickness of the buffer member is about 100 to about 150 µm The display device may further comprise a first adhesive member which is disposed between the strength reinforcing member and the buffer member.

The display device may have wherein a thickness of the first adhesive member is about 20 to about 50 µm.

The display device may have wherein a ratio of the thickness of the strength reinforcing member to the thickness of the first adhesive member is about 1 to about 1.04 times.

The display device may have wherein the under-panel sheet further comprises a heat dissipation member.

The display device may further comprise a second adhesive member which is disposed between the heat dissipation member and the strength reinforcing member.

The display device may have wherein the second adhesive member comprises a thermosetting epoxy or acrylic material.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
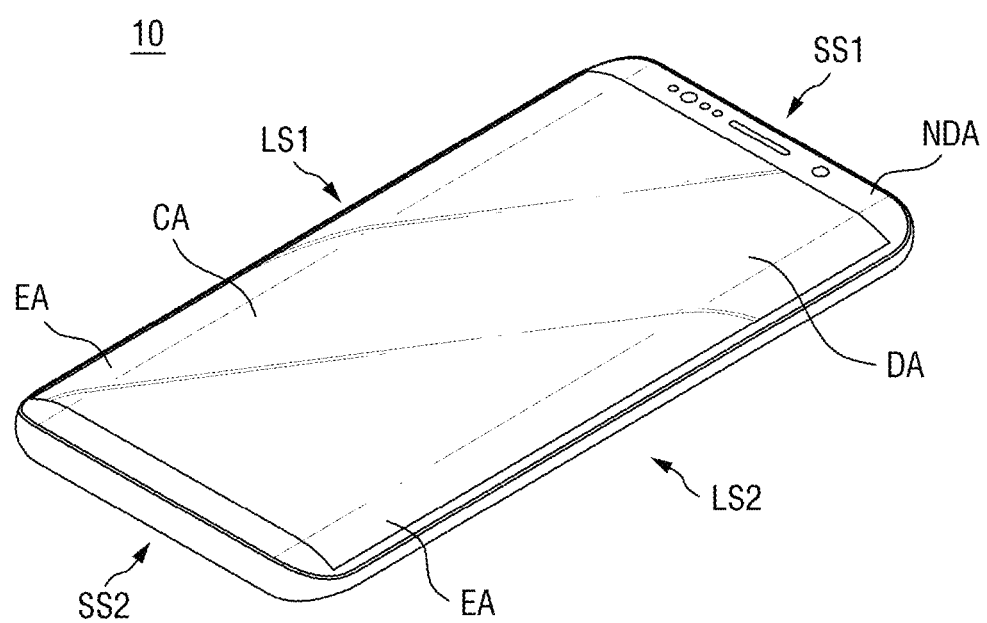
FIG. 1 is a perspective view of a display device according to an embodiment.

Advantages and features of the present disclosure and methods of accomplishing the same may be understood more readily by reference to the following detailed description of exemplary embodiments and the accompanying drawings. The present disclosure may, however, be embodied in many different forms and should not be construed as being limited to the exemplary embodiments set forth herein. Rather, these exemplary embodiments are provided so that this disclosure will be thorough and complete and will fully convey the concept of the present disclosure to those skilled in the art, and the present disclosure will only be defined within the scope of the appended claims.

Cases where elements or layers are referred to as being located "on" other elements or layers include all the cases where other layers or other elements are interposed directly on or between other elements. Meanwhile, cases where the elements are "directly on" indicate that no other element or layer is interposed therebetween. Same reference numerals refer to the same constituent elements throughout the specification. Term "and/or" includes each and every combination of one or more of the referenced items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present inventive concept.

Figure 2:
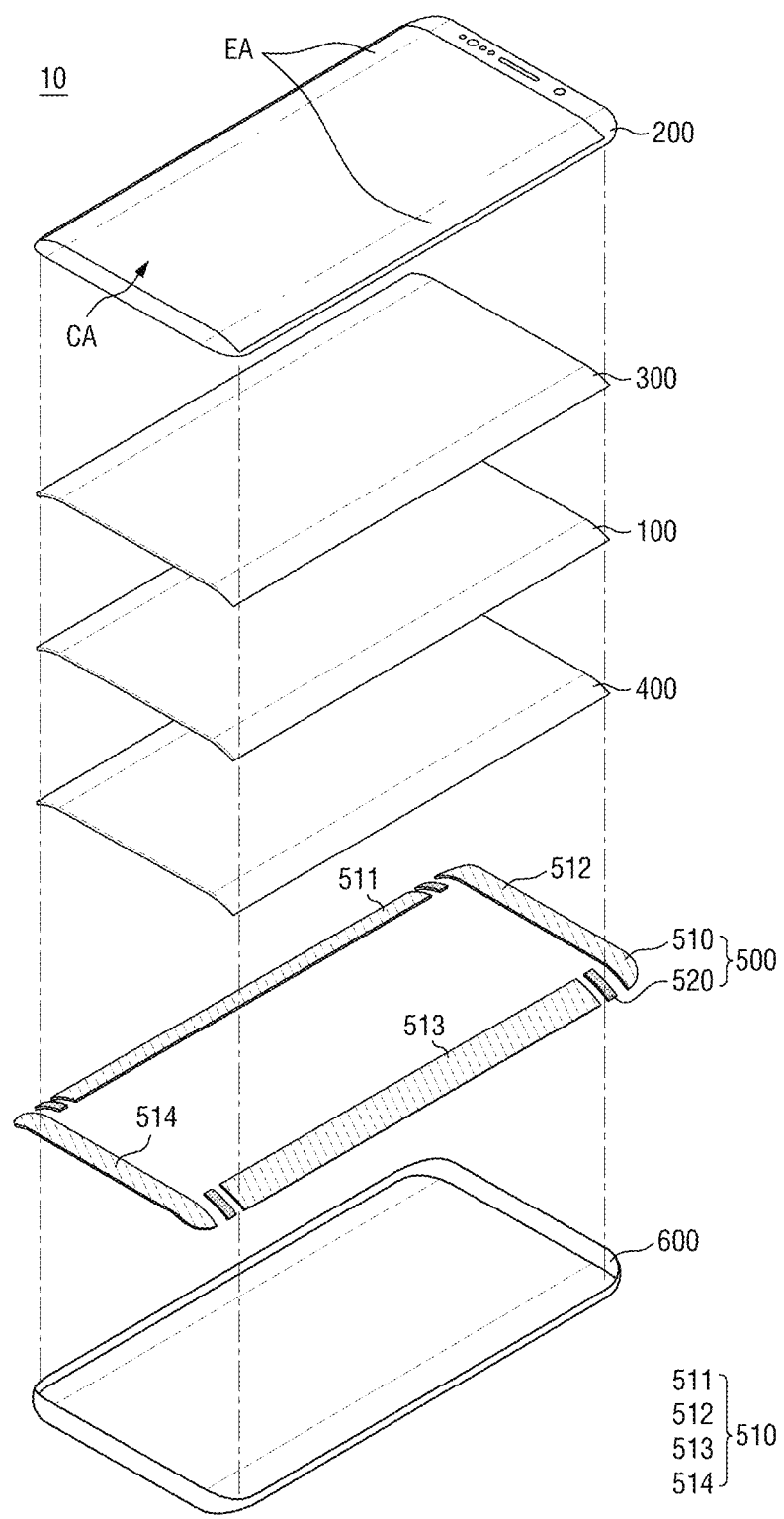
FIG. 2 is an exploded perspective view of the display device according to the embodiment of FIG. 1.

Hereinafter, embodiments of the inventive concept will be described with reference to the attached drawings. FIG. 1 is a perspective view of a display device 10 according to an embodiment. FIG. 2 is an exploded perspective view of the display device 10 according to the embodiment of FIG. 1.

In FIG. 1, a portable terminal is illustrated as an example to which the display device 10 according to the embodiment is applied. The portable terminal may be a tablet PC, a smartphone, a personal digital assistant (PDA), a wearable electronic device, or the like. However, the display device 10 according to the embodiment is not necessarily applied to the above examples and can also be applied to large electronic devices such as a television and an external billboard as well as to small and medium electronic devices such as a personal computer, a notebook computer, a car navigation unit and a camera. That is, the display device 10 according to the embodiment can be applied to other electronic devices without departing from the spirit of the inventive concept.

Referring to FIGS. 1 and 2, the display device 10 includes a display panel 100, an under-panel sheet 400 disposed under the display panel 100, a waterproof member 500 disposed around the under-panel sheet 400, and a bracket 60 disposed under the waterproof member 500. The display device 10 may further include a window 200 disposed on the display panel 100. Unless otherwise defined, the terms "on" and "upper surface" used herein denote a display surface side of the display panel 1, and the terms "under" and "lower surface" used herein denote an opposite side of the display panel 100 from the display surface side.

The display device 10 is divided into a display area DA and a non-display area NDA. The display area DA is an area where a screen is displayed, and the non-display area NDA is an area where a screen is not displayed. The non-display area NDA is disposed around the display area DA. For example, when the display area DA is rectangular, the non-display area NDA may be disposed along four sides of the display area DA.

The display device 10 may be rectangular in plan view. The display device 10 may include a first long side LS1 and a second long side LS2 facing each other and a first short side SS1 and a second short side SS2 facing each other. Each corner where the long side LS1 or LS2 of the display device 10 meets the short side SS1 or SS2 of the display device 10 may be a right angle, but can also form a curved surface as illustrated in FIG. 1. The planar shape of the display device 10 is not limited to the above example and can also be a circular shape or other shapes.

The display panel 100 is a panel for displaying a screen. For example, the display panel 100 may be an organic light emitting display panel. In the following embodiment, a case where an organic light emitting display panel is applied as the display panel 100 will be described. However, other types of display panels such as an electrophoresis device can also be applied as the display panel 100.

The display panel 100 includes a plurality of organic light emitting elements disposed on a substrate. The substrate may be a rigid substrate made of, e.g., glass or a flexible substrate made of, e.g., polyimide. When a polyimide substrate is used as the substrate, the organic light emitting display panel 100 can be curved, bent, folded or rolled.

The window 200 is disposed on the display panel 100. The window 200 is disposed on the display panel 100 to protect the display panel 100 from external impact while transmitting light emitted from the display panel 100. The window 200 may be made of a transparent material such as glass or resin.

The window 200 may overlap the display panel 100 and cover the entire surface of the display panel 100. The window 200 may be larger than the display panel 100. For example, the window 200 may protrude further outward than the display panel 100 at both short sides SS1 and SS2 of the display device 10.

In an embodiment, a touch panel 300 may be disposed between the display panel 100 and the window 200. The touch panel 300 may have substantially the same size as the display panel 100 and may overlap the display panel 100. The display panel 100 and the touch panel 300 may be bonded by an optically clear adhesive (OCA) or an optically clear resin (OCR), and the touch panel 300 and the window 200 may be bonded by the OCA or the OCR. The touch panel 300 can be omitted. In this case, the display panel 100 and the window 200 may be bonded by the OCA or the OCR. In some embodiments, the display panel 100 may further include a touch electrode unit.

The under-panel sheet 400 is disposed under the display panel 100. The under-panel sheet 400 may have substantially the same size as the display panel 100 and may overlap the display panel 100. The under-panel sheet 400 is attached to a lower surface of the display panel 100 to perform a buffering function for protecting the display panel 100 from external impact and a heat dissipation function for releasing heat generated from the display panel 100 to the outside. The under-panel sheet 400 may further perform an electromagnetic wave shielding function, a grounding function, a strength enhancing function, and/or a digitizing function.

The waterproof member 500 is disposed along each side of the under-panel sheet 400. The waterproof member 500 may overlap the under-panel sheet 400 or may be separated from the under-panel sheet 400 by a predetermined distance to not overlap the under-panel sheet 400. The waterproof member 500 can prevent water and other liquids from penetrating into the display device 10. The under-panel sheet 400 and the waterproof member 500 will be described in detail later.

The bracket 600 is disposed under the waterproof member 500. The bracket 600 is disposed under the waterproof member 500 to protect the internal components of the display device 10 disposed on the waterproof member 500 from the outside. The bracket 600 may be shaped like a quadrilateral box having a receiving area. That is, the bracket 600 includes four side surfaces and a bottom surface, and the display panel 100, the touch panel 300, the under-panel sheet 400 and the waterproof member 5 may be disposed in an internal space formed by the side surfaces and bottom surface of the bracket 600.

In an embodiment, the bracket 600 may be tightly coupled to the waterproof member 500 without a gap in order to prevent liquids such as moisture from penetrating into the display device 10. In addition, a portion of the bracket 600 may be exposed to form the external design of the display device 10.

The display device 10 may include a first area CA and a second area EA disposed around the first area CA. Specifically, the first area CA may be disposed substantially on one plan, and the second area EA is not on the same plane as the first area CA. In an embodiment, the second area EA of the display device 10 may have a bent shape. For example, the second area EA may be bent or curved downward from the plane where the first area CA is located. The second area EA may include a surface convexly curved in an outward direction. Alternatively, the second area EA may have a flat surface but may be located in a plane at a predetermined angle to the plane of the first area CA.

In an embodiment, the display device 10 may be composed only of the first area CA. That is, the display device 10 may include only a flat portion located substantially in one plane.

In an embodiment, the display device 10 may not be divided into the first area CA and the second area EA. Instead, the display device 10 may be composed of a single continuous curved surface. For example, the display device 10 may be shaped like a dome.

For ease of description, the following description will be based on the display device 10 including the first area CA and the second area EA located in a different plane from the first area CA, and display devices 20 and 30 composed only of the first area CA will be described later.

The second area EA may be located on both long sides LS1 and LS2 of the rectangular display device 10 or only on any one of the first long side LS1 and the second long side LS2. Although not illustrated in the drawings, the second area EA can also be disposed on either one or both of the short sides SS1 and SS2 of the display device 10.

The display panel 100, the touch panel 300, the window 200, the under-panel sheet 400, the waterproof member 500, and the bracket 600 may all be located in the first area CA and the second area EA.

The under-panel sheet 400 and the waterproof member 500 described above will now be described in more detail.

Figure 3:
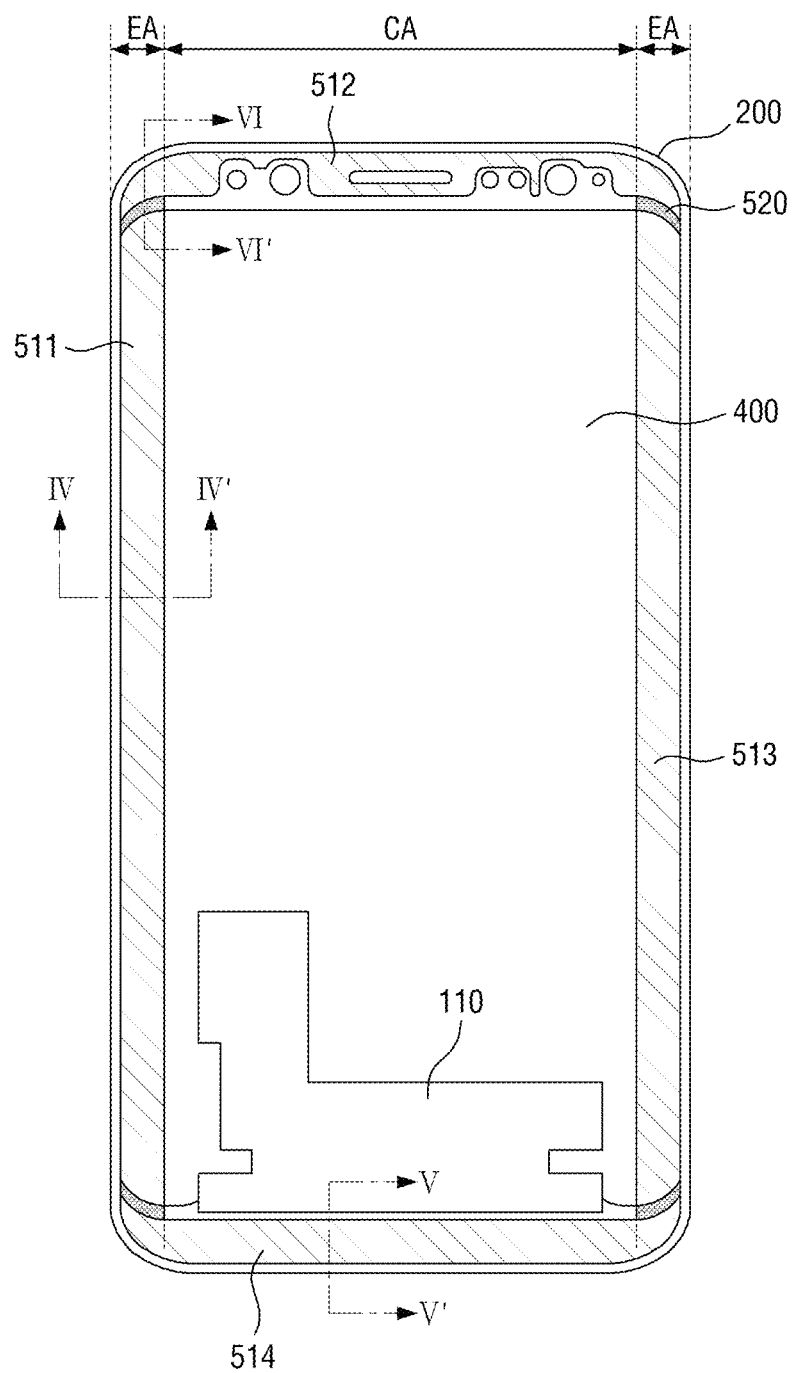
FIG. 3 is a bottom view of the display device according to the embodiment of FIG. 1.
Figure 4:
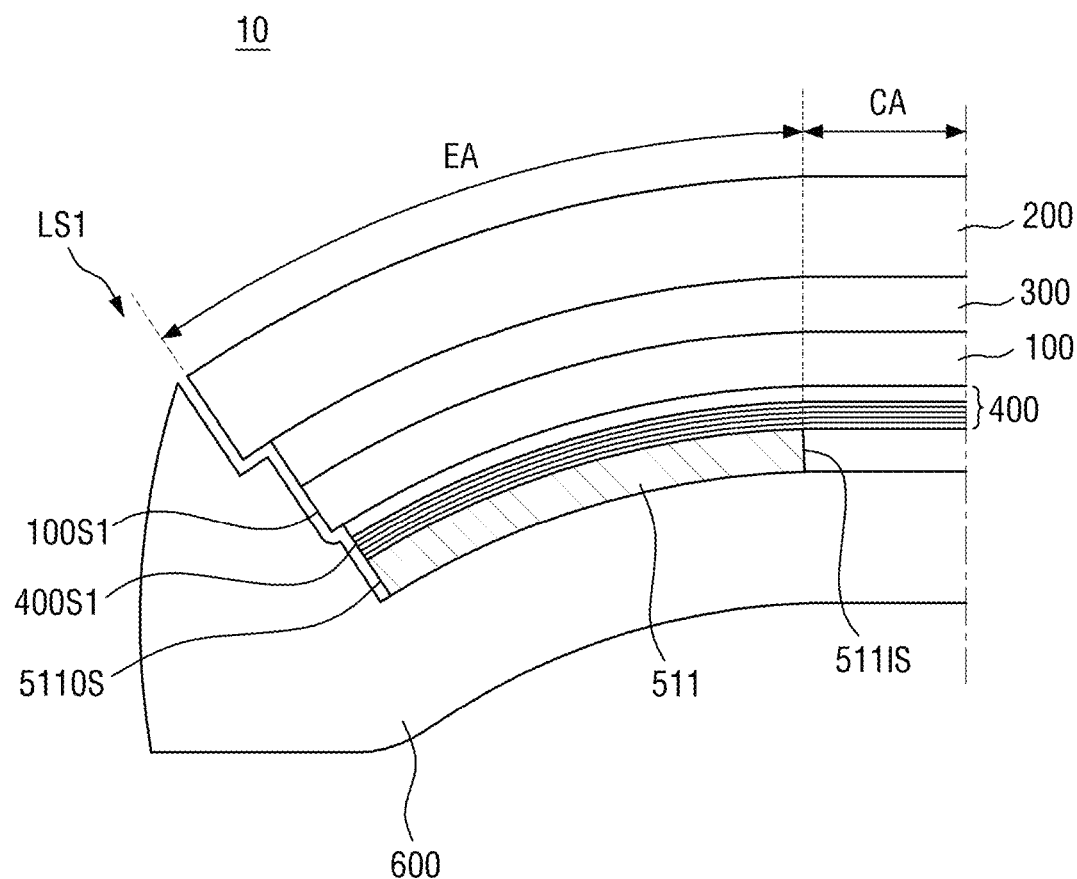
FIG. 4 is a cross-sectional view taken along the line IV-IV' of FIG. 3.
Figure 5:
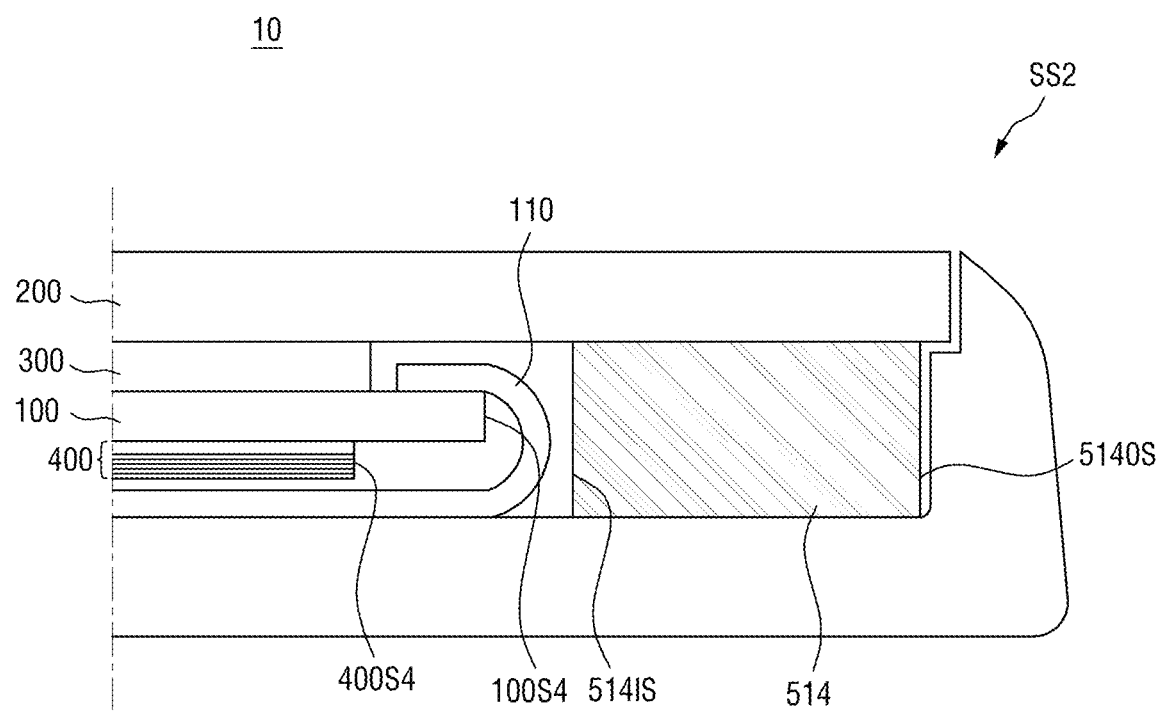
FIG. 5 is a cross-sectional view taken along the line V-V' of FIG. 3.
Figure 6:
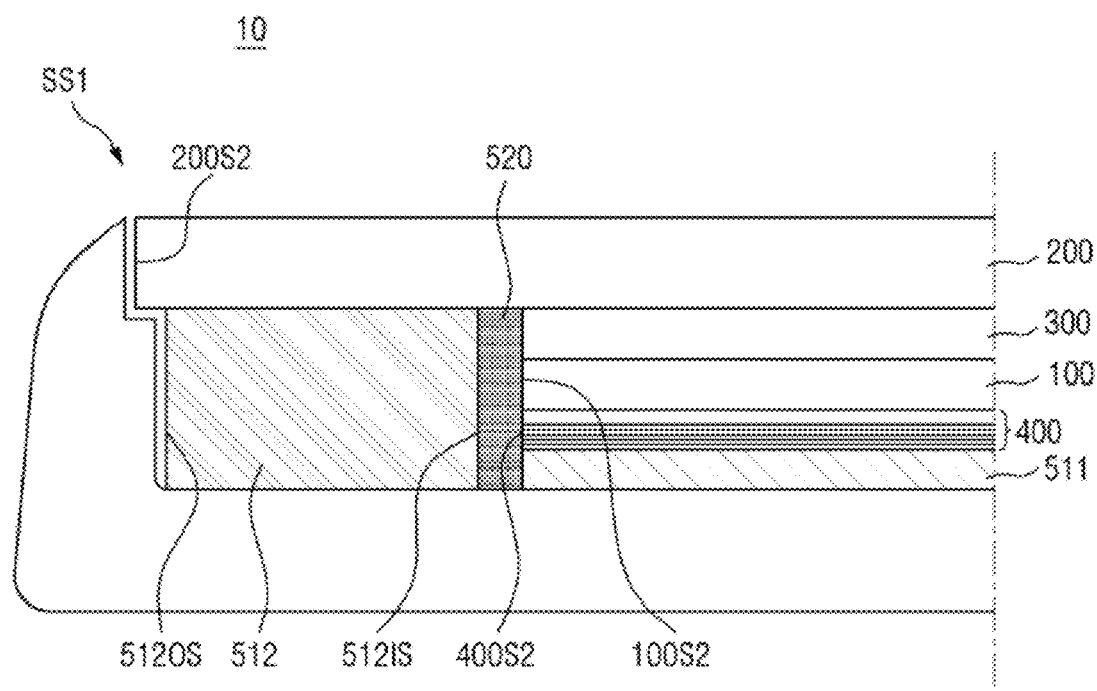
FIG. 6 is a cross-sectional view taken along the VI-VI' of FIG. 3.

FIG. 3 is a bottom view of the display device 10 according to the embodiment of FIG. 1. FIG. 4 is a cross-sectional view taken along the line IV-IV' of FIG. 3. FIG. 5 is across-sectional view taken along the line V-V' of FIG. 3. FIG. 6 is a cross-sectional view taken along the VI-VI' of FIG. 3.

Referring to FIGS. 2 through 6, the under-panel sheet 400 includes at least one functional layer. The functional layer may be a layer that performs a heat dissipation function, an electromagnetic wave shielding function, a grounding function, a buffering function, a strength enhancing function, a support function, and/or a digitizing function. The functional layer may be a sheet layer made of a sheet or a film layer made of a film. However, the functional layer is not limited to the sheet layer or the film layer and can also be a thin layer, a coating layer, a panel, a plate, or the like.

The under-panel sheet 400 may include a plurality of functional layers and an interlayer bonding layer for bonding the functional layers together. The functional layers may overlap each other. Adjacent functional layers may be bonded together by the interlayer bonding layer. Each functional layer and the interlayer bonding layer may have the same size in plan view. However, the inventive concept is not limited to this case, and some or all of the functional layers and the interlayer bonding layer can have different sizes. In addition, any one of the functional layers and the interlayer bonding layer may protrude further outward in a specific direction or in all directions than the other layers. The planar shape of the under-panel sheet 400 may be defined by connecting maximum protruding portions of the stacked functional layers and interlayer bonding layer. The specific composition of the functional layers and interlayer bonding layer will be described later.

As described above, the under-panel sheet 400 may have substantially the same size as the display panel 100 and may overlap the display panel 100. That is, the under-panel sheet 400 may be attached to the lower surface of the display panel 100 by an adhesive member (not illustrated). Specifically, the under-panel sheet 400 may be bent in the same shape as the display panel 100 in the second area EA of the display device 10, that is, at both long sides LS1 and LS2 of the display device 10. In other words, the under-panel sheet 400 having a flat shape may be bent along the curvature of the second area EA of the display panel 100 as it is attached to the lower surface of the display panel 100 having the second area EA. As a result, the under-panel sheet 400 can be attached to the lower surface of the display panel 100 without a lifted area, and the curvature of the second area EA of the display panel 100 may be directly proportional to the curvature of the second area EA of the under-panel sheet 400.

A side surface of the under-panel sheet 400 may be substantially aligned with a side surface of the display panel 100. When the side surface of the under-panel sheet 400 is substantially aligned with the side surface of the display panel 100, an extension surface of the side surface of the under-panel sheet 400 may not only pass the side surface of the display panel 100, but the side surface of the under-panel sheet 400 may also be located further in than the side surface of the display panel 100 by a distance that is hard to be recognized with the naked eye. In an embodiment, as illustrated in FIG. 4, a first side surface 400S1 of the under-panel sheet 400 may be located further in than a first side surface 100S1 of the display panel 100 at both long sides LS1 and LS2 of the display device 10, that is, in the second area EA of the display device 10. However, the distance between the first side surface 400S1 of the under-panel sheet 400 and the first side surface 100S1 of the display panel 100 may be very small. Alternatively, as illustrated in FIG. 6, an extension line of a second side surface 400S2 of the under-panel sheet 400 may pass a second side surface 100S2 of the display panel 100. When it is necessary to distinguish each side surface in the present specification and the accompanying drawings, the side surfaces will be referred as a "first side surface S1," a "second side surface S2." a "third side surface S3," and a "fourth side surface S2." However, when a side surface is simply mentioned without need to distinguish between the different side surfaces, it will be referred as a "side surface." In addition, the first side surface S1 denotes a side surface corresponding to the first long side LS1 of the display device 10, and the second side surface S2, the third side surface S3, and the fourth side surface S4 are arranged in a clockwise direction from the first side surface S1.

In an embodiment, a flexible printed circuit board (FPCB) 110 may be disposed on a side of the display panel 100. In this case, a side surface of the under-panel sheet 400 may be located further in than a side surface of the display panel 100. That is, as illustrated in FIG. 5, when the FPCB 110 is disposed on the second short side SS2 of the display device 10, a fourth side surface 400S4 of the under-panel sheet 400 may be located further in than a fourth side surface 100S4 of the display panel 100 by a predetermined distance. In other words, the display panel may include an area protruding outward from the fourth side surface 400S4 of the under-panel sheet 400 to be exposed. The lower surface of the display panel 100 exposed by the under-panel sheet 400 may provide a space in which the FPCB 110 can be disposed.

Referring again to FIGS. 2 and 3, the waterproof member 500 may be disposed around the under-panel sheet 400. The waterproof member 500 may include, but not limited to, a plurality of line-shaped waterproof tapes 510 extending along the sides of the under-panel sheet 400 and a plurality of waterproof resins 520, each disposed in a space between the waterproof tapes 510. Although not illustrated in the drawings, the waterproof tapes 510 can forma continuous quadrilateral frame shape. In this case, the waterproof resins 520 may be omitted.

In an embodiment, the waterproof tapes 510 may be disposed along the sides LS1, LS2, SS1 and SS2 of the display device 10. Specifically, a first waterproof tape 511, a second waterproof tape 512, a third waterproof tape 513, and a fourth waterproof tape 514 may be disposed along both long sides LS1 and LS2 and both short sides SS1 and SS2 of the display device 10. The planar shape of each of the waterproof tapes 510 may be substantially similar to a rectangle. However, each of the waterproof tapes 510 may include a hole or a protruding region corresponding to a camera region, a speaker region, and the like.

The waterproof tapes 510 may be attached to a lower surface of the under-panel sheet 400 on both long sides LS1 and LS2 of the display device 10. Specifically, the first waterproof tape 511 and the third waterproof tape 513 may have the same shape as the planar shape of the under-panel sheet 400 and may overlap the under-panel sheet 400. Referring to FIG. 4, an outer side surface 511OS of the first waterproof tape 511 may be substantially aligned with the first side surface 400S1 of the under-panel sheet 400, and an inner side surface 511IS of the first waterproof tape 511 may be substantially aligned with a boundary between the second area EA and the first area CA. That is, the first waterproof tape 511 and the third waterproof tape 513 may be disposed only in the second area EA on both long sides LS1 and LS2 of the display device 10. However, the inventive concept is not limited to this case, and the first waterproof tape 511 and the third waterproof tape 513 can also extend from the second area EA to the first area CA.

The waterproof tapes 510 may not overlap the display panel 100 on both short sides SS1 and SS2 of the display device 10 and may be attached to a lower surface of the window 200. Specifically, each of the second waterproof tape 512 and the fourth waterproof tape 514 may be disposed in an area where the display panel 100 is not disposed, that is, on the lower surface of the window 200 protruding outward from a side surface of the display panel 100. In an exemplary embodiment, the second waterproof tape 512 may not overlap the display panel 100 as illustrated in FIG. 6. In other words, an inner side surface 512IS of the second waterproof tape 512 may be spaced outward from the second side surface 100S2 of the display panel 100 by a predetermined distance. An outer side surface 512OS of the second waterproof tape 512 is located inside a second side surface 200S2 of the window 200. In other words, the window 200 may protrude from the outer side surface 512OS of the second waterproof tape 512, so that a portion of the lower surface of the window 200 is exposed.

In an embodiment, when the FPCB 110 is disposed on a side of the display panel 100, a waterproof tape 510 may not overlap the FPCB 110. That is, as illustrated in FIG. 5, an inner side surface 514IS of the fourth waterproof tape 514 may be spaced apart from an outermost portion of the FPCB 110 by a predetermined distance.

Thicknesses of the waterproof tapes 511 and 513 attached to the lower surface of the under-panel sheet 400 may be different from those of the waterproof tapes 512 and 514 attached to the lower surface of the window 200. That is, the second waterproof tape 512 and the fourth waterproof tape 514 attached to the lower surface of the window 200 may be formed thicker than the first waterproof tape 511 and the third waterproof tape 513 attached to the lower surface of the lower panel 400 to compensate for a step difference. In a specific embodiment, the thickness of the second waterproof tape 512 may be the same as the sum of the thickness of the first waterproof tape 511, the thickness of the touch panel 300, the thickness of the display panel 100 and the thickness of the under-panel sheet 400, as illustrated in FIG. 6. In other words, a shortest distance from the lower surface of the window 200 to a lower surface of the first waterproof tape 511 may be the same as a shortest distance from the lower surface of the window 200 to a lower surface of the second waterproof tape 512. In this case, the difference between the thicknesses of the waterproof tapes 510 (511 and 512) can compensate for a step difference created by the display panel 100, the touch panel 300 and the under-panel sheet 400 disposed between the first waterproof tape 511 and the window 200. In addition, the buffering function and/or the heat dissipation function can be provided by the thick waterproof tapes 512 and 514 on both short sides SS1 and SS2 of the display device 10 where the under-panel sheet 400 is not disposed.

The first waterproof tape 511 and the third waterproof tape 513 disposed along both long sides LS1 and LS2 of the display device 10 may be arranged adjacent to the second waterproof tape 512 and the fourth waterproof tape 514 disposed along both short sides SS1 and SS2 of the display device 10 at each corner of the display device 10. Specifically, a short side of the first waterproof tape 511 extending in a lengthwise direction of the display device and a short side of the third waterproof tape 513 extending in the lengthwise direction of the display device 10 may be disposed adjacent to a long side of the second waterproof tape 512 extending in a widthwise direction of the display device 10. In addition, the other short side of the first waterproof tape 511 and the other short side of the third waterproof tape 513 may be disposed adjacent to a long side of the fourth waterproof tape 514. However, the waterproof tapes 511 through 514 may not overlap each other, and a space may be formed between the waterproof tapes 511 through 514. In a specific embodiment, since the first waterproof tape 511 can be disposed only in the second area EA, a short side of the first waterproof tape 511 may be disposed adjacent to a region of a long side of the second waterproof tape 512 which is disposed in the second area EA.

A waterproof resin 520 may be disposed in each space between the waterproof tapes 511 through 514. The waterproof resin 520 may fill each space between the waterproof tapes 510 to completely block the area inside the waterproof member 500 from the outside. That is, the waterproof resin 520 may be disposed to prevent the formation of a gap between the waterproof tapes 511 through 514. Further, the waterproof resin 520 may be disposed in a space between the side surfaces of the display panel 100, the touch panel 300 and the under-panel sheet 400. As a result, the waterproof resins 520 may connect the waterproof tapes 511 through 514, so that the waterproof member 500 can have a continuous frame shape as a whole. The waterproof member 500 may be coupled to the bracket 600 to completely block the area inside the waterproof member 500 from an external material.

In an embodiment, the waterproof tapes 510 may be double-sided tapes having a waterproof function. In this case, since no additional adhesive is required, the display device 10 can be made slimmer. Each of the waterproof tapes 510 includes a substrate (not illustrated) and a bonding layer (not illustrated) disposed on upper and lower surfaces of the substrate. The substrate may be made of, but not limited to, polyurethane (PU) or polyethylene terephthalate (PET). The bonding layer may include an adhesive layer, a sticky layer, or a resin layer. For example, the bonding layer may contain a polymer material classified into a silicone polymer, a urethane polymer, an SU polymer having a silicone-urethane hybrid structure, an acrylic polymer, an isocyanate polymer, a polyvinyl alcohol polymer, a gelatin polymer, a vinyl polymer, a latex polymer, a polyester polymer, a water-based polyester polymer, or the like.

Figure 7:
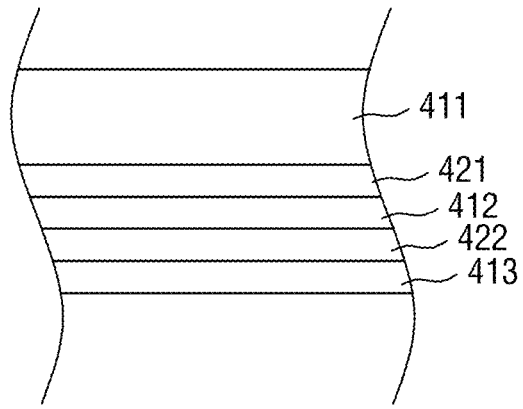
FIG. 7 is a cross-sectional view of an under-panel sheet according to an embodiment.
Figure 8:
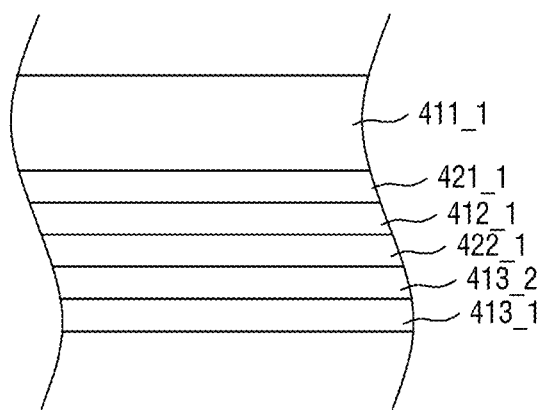
FIG. 8 is a cross-sectional view of an under-panel sheet according to an embodiment.

FIG. 7 is a cross-sectional view of an under-panel sheet 400 according to an embodiment. FIG. 8 is a cross-sectional view of an under-panel sheet 401 according to an embodiment. In FIGS. 7 and 8, the specific stacked structure of each of the under-panel sheets 400 and 401 is illustrated.

Referring to FIG. 7, the under-panel sheet 400 may include a first functional layer 411, a second functional layer 412, and a third functional layer 413 stacked sequentially. In addition, the under-panel sheet 400 may include a first interlayer bonding layer 421 and a second interlayer bonding layer 422 which bond the functional layer 411, the second function layer 412 and the third functional layer 413 together.

The first functional layer 411 is a functional layer located at an uppermost position, that is, a functional layer disposed closest to the display panel 100. In an embodiment, the first functional layer 411 may be a buffer member that alleviates external impact. The first functional layer 411 can prevent the display device 10 from being damaged by absorbing some of the impact applied to the display panel 100.

The first functional layer 411 may be made of a polymer resin such as polyurethane, polycarbonate, polypropylene or polyethylene, or may be made of a sponge formed by foaming a rubber liquid, a urethane material or an acrylic material.

The first functional layer 411 may have a thickness of about 100 to about 150 μm. When the thickness of the first functional layer 411 is about 150 m or less, a sufficient buffering effect can be obtained while the display device 10 can be made thinner. When the thickness of the first functional layer 411 is about 100 μm or more, the first functional layer 411 is thick enough to fully absorb external impact. Therefore, the first functional layer 411 can effectively protect the display device 10.

The second functional layer 412 may be disposed under the first functional layer 411. In an embodiment, the second functional layer 412 may be a support member that supports the under-panel sheet 400. In addition, the second functional layer 412 may be a strength reinforcing member that reinforces the display device 10 against external impact. That is, the second functional layer 412 assists the first functional layer 411 to secure the maximum impact resistance of the display device 10.

The second functional layer 412 may include a polymer resin such as polyimide (PI) or polyethylene terephthalate (PET).

In an exemplary embodiment, the second functional layer 412 may be made of polyimide (PI). Since the polyimide (PI) has excellent heat resistance, even if the display device 10 is exposed to a high temperature, the second functional layer 412 may hardly contract. Here, the term "high temperature" denotes a high enough temperature to which people can be exposed in their daily lives, for example, a temperature of 40 degrees or more. When the second functional layer 412 contracts, the under-panel sheet 400 may be distorted and thus detached from the display panel 100. In this case, each function of the under-panel sheet 400 may not be sufficiently exhibited. In addition, if the second functional layer 412 contracts, a gap may be formed between the waterproof member 500 and the second functional layer 412. Therefore, the waterproof performance can be degraded.

A thickness of the second functional layer 412 may be within the range of about 25 to 50 μm. That is, a ratio of the thickness of the first functional layer 411 to the thickness of the second functional layer 412 may be about 3 to 6 times. Preferably, the ratio of the thickness of the first functional layer 411 to the thickness of the second functional layer 412 may be about 3 to 6 times. The display device 10 including the bent second area EA may be vulnerable to external impact as compared with the display devices 20 and 30 composed only of the first area CA. That is, when an impact of the same intensity is applied, a bent portion is subjected to a greater stress than a flat portion. Therefore, the display device 10 including the bent second area EA can be easily damaged by external impact. When the thickness of the second functional layer 412 is about 25 μm or more, in other words, when the ratio of the thickness of the first functional layer 411 to the thickness of the second functional layer 412 is 3 times or more, not only the first area CA but also the second area EA can be sufficiently protected. In addition, when the ratio of the thickness of the first functional layer 411 to the thickness of the second functional layer 412 is 3 times or more, the second functional layer 412 can withstand the pressure transmitted from the outside to the display device 10, thereby more effectively preventing the display panel 100 from being damaged. Also, the second functional layer 412 can be prevented from contracting due to heat.

When the thickness of the second functional layer 412 is about 50 μm or less, that is, when the ratio of the thickness of the first functional layer 411 to the thickness of the second functional layer 412 is 6 times or less, the second functional layer 412 may be elastic enough to be disposed along the second area EA of the display device 10.

Specifically, the second functional layer 412 can have a high level of elasticity depending on the characteristics of its constituent material. For example, when the second functional layer 412 is made of polyimide (PI), the elastic modulus of the second functional layer 412 is about 330 kg/mm2. Therefore, when the second functional layer 412 is too thick, it may be difficult for the second functional layer 412 to bend with an appropriate curvature along the curvature of the second area EA. In an exemplary embodiment, the thickness of the first functional layer 411 may be about 125 μm, and the thickness of the second functional layer 412 may be about 25 μm.

The first interlayer bonding layer 421 may be disposed between the first functional layer 411 and the second functional layer 412. That is, the first interlayer bonding layer 421 may be interposed between the first functional layer 411 and the second functional layer 412 to bond the first functional layer 411 and the second functional layer 412 together.

The first interlayer bonding layer 421 may be an adhesive layer containing an adhesive or a sticking agent. For example, the first interlayer bonding layer 421 may be a pressure sensitive adhesive (PSA), an OCA, or an OCR.

A thickness of the first interlayer bonding layer 421 may be similar to the thickness of the second functional layer 412. That is, a ratio of the thickness of the second functional layer 412 to the thickness of the first interlayer bonding layer 421 may be 1 to 2.5 times, preferably, 1 to 1.5 times, and, more preferably, 1 to 1.04 times. If the first interlayer bonding layer 421 is too thin compared with the second functional layer 412, the first functional layer 411 and the second functional layer 412 may not be sufficiently bonded together. In addition, if the first interlayer bonding layer 421 is too thick compared with the second functional layer 412, the overall thickness of the under-panel sheet 400 may increase, making it difficult to make the display device 10 thinner.

Further, the thickness of the first interlayer bonding layer 421 may be about 20 to about 50 μm, preferably, 25 to 35 μm, and, more preferably, 26 μm. If the first interlayer bonding layer 421 is too thick, the thickness of the display device 10 cannot be reduced, and the material cost is increased. Therefore, the thickness of the first interlayer bonding layer 421 may be 50 mm or less. The first interlayer bonding layer 421 may have an adhesive strength sufficient to prevent the first functional layer 411 and the second functional layer 412 from being detached from each other. That is, the first interlayer bonding layer 421 should have an adhesive strength sufficient to maintain the second functional layer 412 having a certain level of elasticity in a bent shape while keeping the second functional layer 412 attached to the first functional layer 411. The first interlayer bonding layer 421 having a thickness of about 20 μm or more can secure an adhesive strength sufficient to firmly bond the first functional layer 411 and the second functional layer 412. The first interlayer bonding layer 421 having a thickness of 26 μm can have an adhesive strength sufficient to prevent the first functional layer 411 and the second functional layer 412 from being isolated from each other by the elastic force of the second functional layer 412 in the second area EA while making the display device 10 thinner.

The third functional layer 413 may be disposed under the second functional layer 412. In an embodiment, the third functional layer 413 may be a heat dissipation member. The third functional layer 413 can shield an electromagnetic wave and dissipate the heat generated inside the display device 10 to the outside. For example, the third functional layer 413 may be made of a conductive metal having good thermal conductivity such as copper, silver, gold, aluminum, nickel, or a combination of these metals.

The third functional layer 413 may have a thickness of about 9 to 18 μm. When the thickness of the third functional layer 413 is about 9 μm or more, the third functional layer 413 can rapidly diffuse the heat generated inside the display device 10 to suppress a local temperature rise in the display device 10. When the thickness of the third functional layer 413 is about 18 μm or less, an increase in the manufacturing cost can be prevented, and the display device 10 can be made thinner.

The second interlayer bonding layer 422 may be disposed between the second functional layer 412 and the third functional layer 413. That is, the second interlayer bonding layer 422 may be interposed between the second functional layer 412 and the third functional layer 413 to bond the second functional layer 412 and the third functional layer 413 together.

The second interlayer bonding layer 422 may be made of, but not limited to, an acrylic adhesive, an epoxy adhesive, a silicone adhesive, or a mixture of these materials. In an embodiment, the second interlayer bonding layer 422 may be made of an adhesive containing a thermosetting epoxy material. When the second interlayer bonding layer 422 undergoes heat curing, the strength of the second interlayer bonding layer 422 is increased. Therefore, the second interlayer bonding layer 422 can protect the display device 10 more effectively. In an embodiment, the second interlayer bonding layer 422 may be made of an acrylic adhesive. Since an acrylic adhesive layer has a heat conduction function, a more excellent heat dissipation performance can be secured.

Referring to FIG. 8, a fourth functional layer 413_2 may be disposed between a second functional layer 412_1 and a third functional layer 413_1 of the under-panel sheet 401.

The fourth functional layer 413_2 may include thermally conductive particles. The thermally conductive particles may be particles having a thermal conductivity of 1 W/mK or more. Examples of the thermally conductive particles include carbon black, carbon nanotubes, carbon nanofibers, and graphenes. The fourth functional layer 413_2 may include a single type of thermally conductive particles or a mixture of two or more types of thermally conductive particles. In this case, the third functional layer 413_1 can function to fix the thermally conductive particles.

The above thermally conductive particles may have a plate-like structure in which carbon atoms are connected in a horizontal direction. In this case, the fourth functional layer 413_2 may have a higher thermal conductivity in the horizontal direction than in a vertical direction and may have an excellent heat dissipation effect. In addition, since the fourth functional layer 413_2 can have a good elastic modulus, it may be disposed only in the first area CA and not in the second area EA.

The fourth functional layer 413_2 may have a thickness of about 15 to 25 μm, preferably, 17 μm. When the thickness of the fourth functional layer 413_2 is about 15 μm or more, a sufficient heat dissipation effect in the vertical direction can be obtained. When the thickness of the fourth functional layer 413_2 is less than about 25 μm, the display device 10 can be made thinner.

In the above embodiments, a case where the first functional layers 411 and 41_1 are buffer members, the second functional layers 412 and 412_1 are strength reinforcing members, the third functional layers 413 and 413_1 and the fourth functional layer 414 and 414_1 are heat dissipation members has been described. Here, the stacking order can be appropriately changed within a range that does not impair the objectives of the inventive concept. For example, the first functional layers 411 and 41_1 may be strength reinforcing members, the second functional layers 412 and 412_1 may be buffer members, and the third functional layers 413 and 413_1 and the fourth functional layer 414 and 414_1 may be heat dissipation members.

Hereinafter, other embodiments of the inventive concept will be described.

Figure 9:
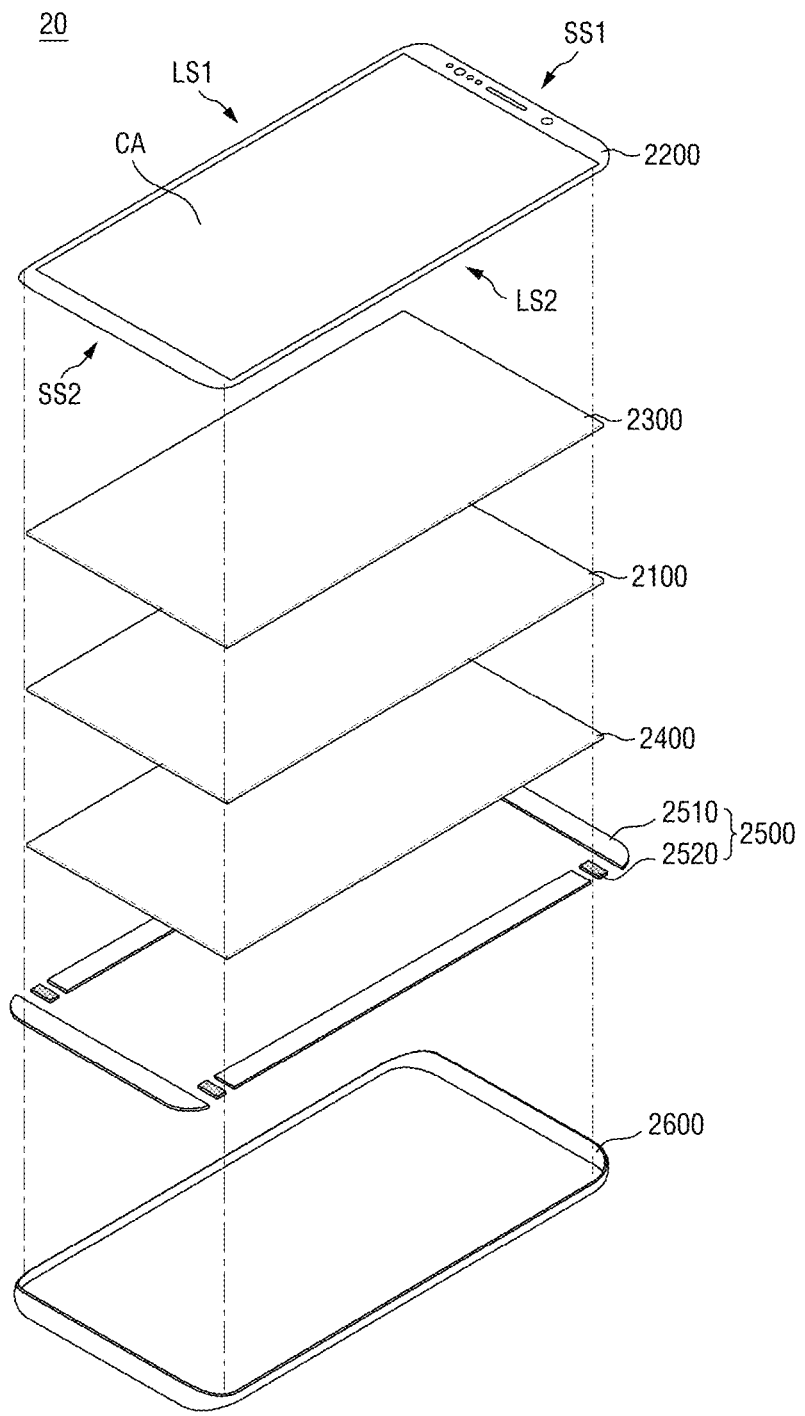
FIG. 9 is an exploded perspective view of a display device according to an embodiment.
Figure 10:
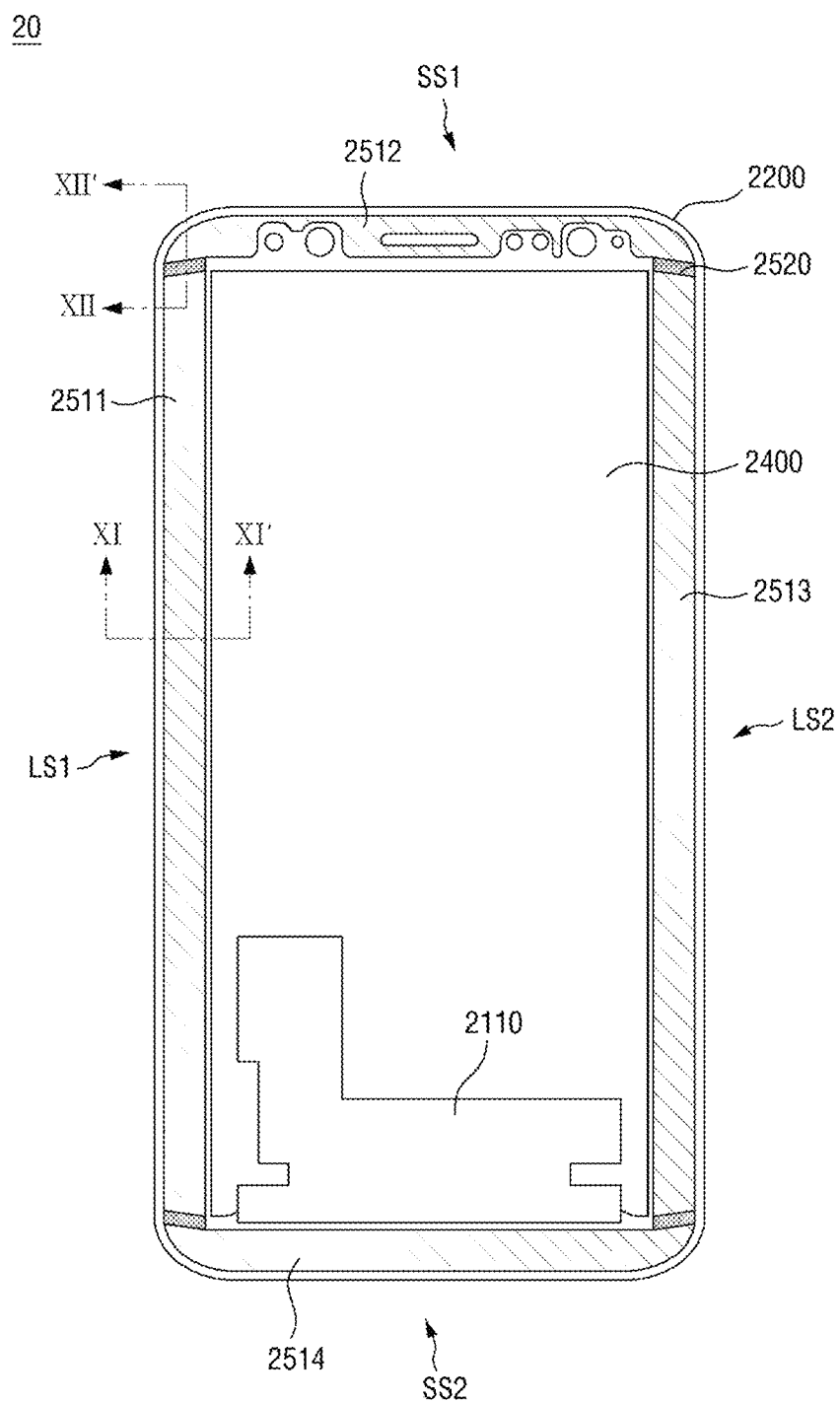
FIG. 10 is a rear view of the display device according to the embodiment of FIG. 9.

FIG. 9 is an exploded perspective view of a display device 20 according to an embodiment. FIG. 10 is a rear view of the display device 20 according to the embodiment of FIG. 9. FIGS. 9 and 10 show that an under-panel sheet 2400 and a waterproof member 2500 can also be applied to the flat display device 20. In the following embodiment, a description of components identical to those of the above-described embodiment will be omitted or given briefly, and differences from the above-described embodiment will be mainly described.

Referring to FIGS. 9 and 10, the display device 20 may be composed only of a first area CA. That is, the display device 20 may be a flat display device that is formed generally flat without a bent area.

The waterproof member 2500 of the display device 20 may not overlap the under-panel sheet 2400 and may be disposed on a lower surface of a window 2200. That is, a first waterproof tape 2511 and a third waterproof tape 2513 disposed on both long sides LS1 and LS2 of the display device 20 may not overlap the under-panel sheet 2400 and may be disposed directly on the lower surface of the window 2200. In other words, the waterproof member 2500 may be disposed on an exposed portion of the lower surface of the window 2200 which protrudes outward from side surfaces of the display panel 2100. However, the inventive concept is not limited to this case, and the first waterproof tape 2511 and the third waterproof tape 2513 can also overlap the under-panel sheet 2400 to be disposed directly on a lower surface of the under-panel sheet 2400, like the first waterproof tape 511 and the third waterproof tape 513 of the display device 10 according to the embodiment of FIG. 1.

Figure 11:
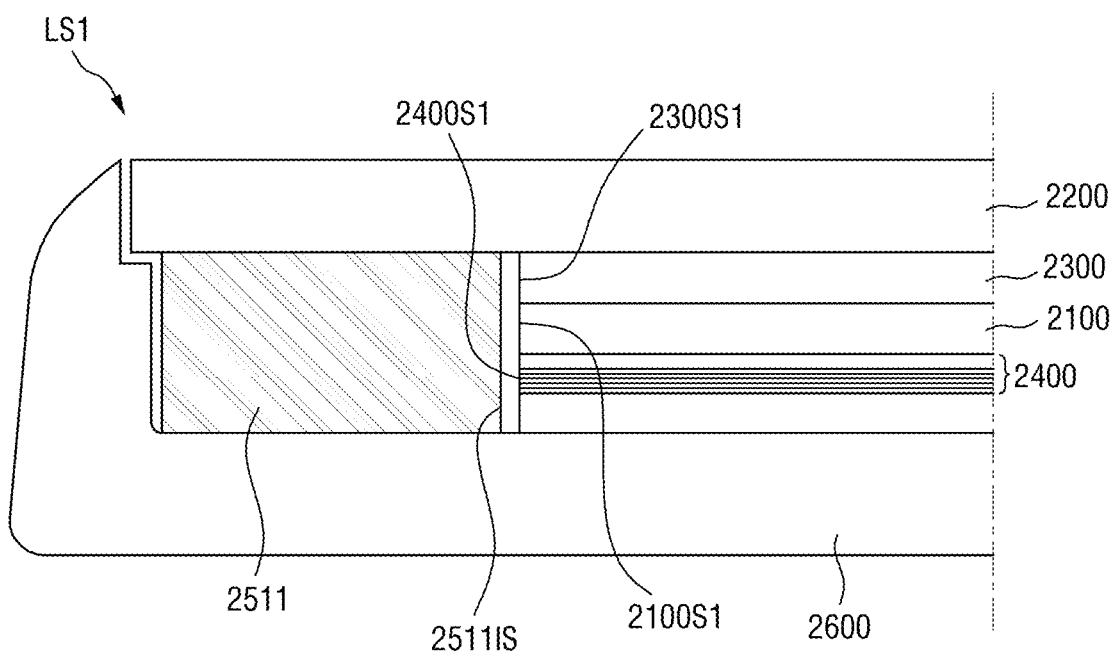
FIG. 11 is a cross-sectional view taken along the line XI-XI' of FIG. 10.

FIG. 11 is a cross-sectional view taken along the line XI-XI' of FIG. 10.

Referring to FIGS. 10 and 11, a side surface 2100S1 of the display panel 2100, a side surface 2300S1 of a touch panel 2300, and a side surface 2400S1 of the under-panel sheet 2400 may be substantially aligned with each other.

An inner side surface of the waterproof tape 2510 (2511 and 2513) may be spaced outward from the side surface 2400S1 of the under-panel sheet 2400 by a predetermined distance. That is, as illustrated in FIG. 11, an inner side surface 2511IS of the first waterproof tape 2511 may be located outside the side surface 2400S of the under-panel sheet 2400.

Figure 12:
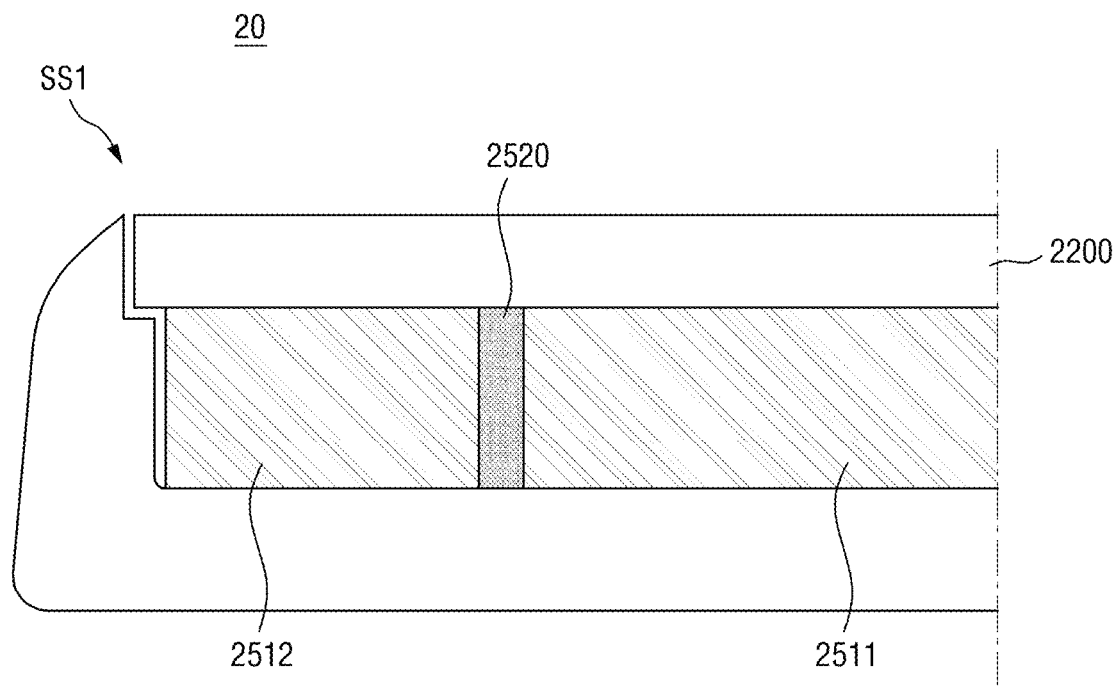
FIG. 12 is a cross-sectional view taken along the line XII-XII' of FIG. 10.

FIG. 12 is a cross-sectional view taken along the line XII-XII' of FIG. 10.

Referring to FIGS. 10 and 12, the waterproof tapes 2511 through 2514 may have the same thickness. That is, since all of the waterproof tapes 2511 through 2514 are disposed on the lower surface of the window 2200, no step is formed between them.

Therefore, the waterproof tapes 2511 through 2514 can have the same thickness.

The waterproof tapes 2511 through 2514 may be separated from each other by a predetermined distance at each corner of the display device 20. That is, the first waterproof tape 2511, the second waterproof tape 2512, the third waterproof tape 2513, and the fourth waterproof tape 2514 may be disposed adjacent to each other but may not overlap each other.

A waterproof resin 2520 may be disposed in each space between the waterproof tapes 2511 through 2514.

In an embodiment, as illustrated in FIG. 12, the waterproof resin 2520 may be disposed in a space between a short side of the first waterproof tape 2511 and a long side of the second waterproof tape 2512.

Although not illustrated in the drawings, in an embodiment, a space may be formed between a long side of the first waterproof tape 2511 and a short side of the second waterproof tape 2512. That is, while a space is formed in the widthwise direction of the display device 20 in FIGS. 10 and 12, it can also be formed in the lengthwise direction of the display device 20 in an embodiment. In this case, the waterproof resin 2520 may be disposed in each space formed in the lengthwise direction of the display device 20.

In the current embodiment, the inside of the display device 20 may be completely blocked from the outside by the waterproof member 2500 and a bracket 2600 coupled to the waterproof member 2500. That is, since there is no space between the waterproof member 2500 and the bracket 2600, it may be difficult for a liquid outside the display device 20 to penetrate into the display device 20.

Figure 13:
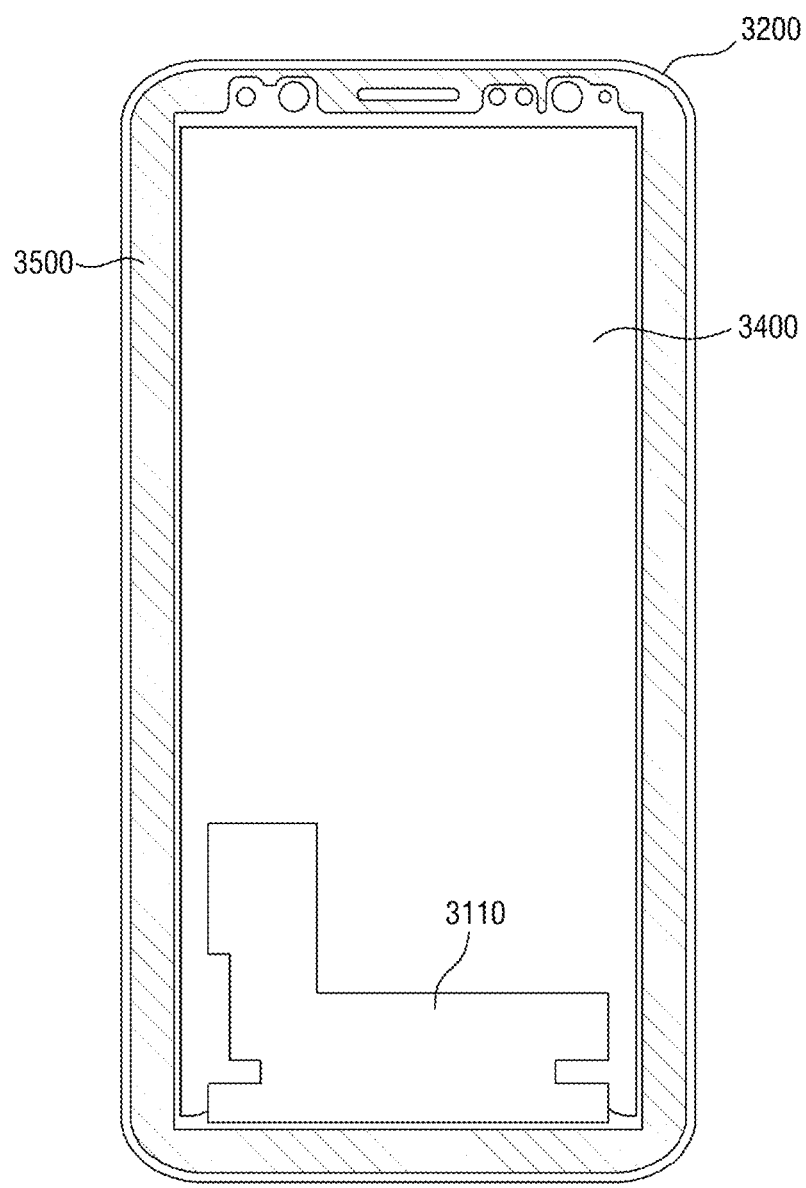
FIG. 13 is a rear view of a display device according to an embodiment.

FIG. 13 is a rear view of a display device 30 according to an embodiment.

Referring to FIG. 13, a waterproof member 3500 of the display device 30 may be shaped like a continuous line extending along the outer periphery of a window 3200. That is, the waterproof member 3500 may be formed only of a waterproof tape and shaped like a quadrilateral frame. In this case, since a space formed between a plurality of waterproof tapes is non-existent, a waterproof resin can be omitted.

The waterproof member 3500 may have the same thickness throughout the display device 30. That is, like the waterproof member 2500 of the display device 20, the waterproof member 3500 of the display device 30 does not overlap an under-panel sheet 3400 and is disposed on a lower surface of the window 3200. Therefore, no step may be formed between areas of the waterproof member 3500.

The display device 30 according to the current embodiment can protect internal components of the display device 30 from an external liquid such as moisture by using only the waterproof tape 3500. That is, the omission of the waterproof resin can simplify the process and reduce the cost.

A display device according to an embodiment includes an under-panel sheet having a strength reinforcing member, and the under-panel sheet prevents the display device from being damaged by external impact.

In addition, since the introduction of a liquid such as moisture into the display device is prevented, a waterproof function of the display device can be improved.

However, the effects of the inventive concept are not restricted to the one set forth herein. The above and other effects of the inventive concept will become more apparent to one of daily skill in the art to which the inventive concept pertains by referencing the claims.

While the inventive concept has been particularly illustrated and described with reference to exemplary embodiments thereof, it will be understood by those of ordinary skill in the art that various changes in form and detail may be made therein without departing from the spirit and scope of the inventive concept as defined by the following claims. The exemplary embodiments should be considered in a descriptive sense only and not for purposes of limitation.

What is claimed is:

1. A display device comprising:
   a display panel which comprises a first side extending in a first direction, a second side extending in a second direction intersecting the first direction, a third side opposite to the first side, and fourth side opposite to the second side;
   a window which is disposed on the display panel and comprises a first area overlapping the display panel and a second area protruding outward from the display panel;
   a bracket disposed under the display panel; and
   a waterproof tape disposed between the window and the bracket,
   wherein the waterproof tape comprises:
      a first waterproof portion disposed along the first side of the display panel,
      a second waterproof portion disposed along the second side of the display panel,
      a third waterproof portion disposed along the third side display panel, and
      a fourth waterproof portion disposed along the fourth side of the display panel, and
   wherein the first waterproof portion overlaps the display panel, and the second waterproof portion overlaps the second area of the window.

2. The display device of claim 1, further comprising:
   a first waterproof resin disposed in a space between the first waterproof portion and the second waterproof portion.

3. The display device of claim 2, wherein the first waterproof resin overlaps the second area of the window.

4. The display device of claim 1, wherein the third waterproof portion overlaps the display panel, and
   wherein the fourth waterproof portion overlaps the second area of the window.

5. The display device of claim 4, further comprising:
   a first waterproof resin disposed in a space between the first waterproof portion and the second waterproof portion; and
   a second waterproof resin disposed in a space between the third waterproof portion and the second waterproof portion.

6. The display device of claim 5, wherein the first waterproof resin and the second waterproof resin overlap the second area of the window.

7. The display device of claim 1, wherein the first waterproof portion is disposed between the display panel and the bracket, and
   wherein the second waterproof portion does not overlap the display panel.

8. The display device of claim 1, further comprising:
   a flexible circuit board disposed at the second side of the display panel,
   wherein the second waterproof tape does not overlap the flexible circuit board.

9. The display device of claim 1, further comprising:
   an under-panel sheet disposed between the display panel and the bracket,
   wherein the first waterproof portion and the third waterproof portion are disposed between the under-panel sheet and the bracket, and
   wherein the second waterproof portion and the fourth waterproof portion do not overlap the under-panel sheet.

10. The display device of claim 9, wherein the first waterproof portion and the third waterproof portion directly contact the under-panel sheet and the bracket, and
    wherein the second waterproof portion and the fourth waterproof portion directly contact the bracket and the window.

11. The display device of claim 9, wherein the under-panel sheet comprises a buffer member and a strength reinforcing member.

12. The display device of claim 11, wherein the strength reinforcing member comprises polyimide (PT).

13. The display device of claim 1, wherein the fourth waterproof portion is extended from the first waterproof portion in the second direction, and
    wherein the third waterproof portion is extended from the fourth waterproof portion in the first direction.

14. The display device of claim 1, wherein a length of the first side of the display panel in the first direction is longer than a length of the second side of the display panel in the second direction.

* * * * *